US012614485B2

(12) United States Patent
Bae et al.

(10) Patent No.: US 12,614,485 B2
(45) Date of Patent: Apr. 28, 2026

(54) LIGHTING INSPECTION CIRCUIT AND DISPLAY DEVICE INCLUDING THE SAME

(71) Applicant: LG Display Co., Ltd., Seoul (KR)

(72) Inventors: Hyunjik Bae, Paju-si (KR); SangMoo Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/891,313

(22) Filed: Sep. 20, 2024

(65) Prior Publication Data

US 2025/0232698 A1 Jul. 17, 2025

(30) Foreign Application Priority Data

Jan. 15, 2024 (KR) ........................ 10-2024-0006256

(51) Int. Cl.
*G09G 3/00* (2006.01)
*G09G 3/3233* (2016.01)
*H10K 59/131* (2023.01)

(52) U.S. Cl.
CPC ........... *G09G 3/006* (2013.01); *G09G 3/3233* (2013.01); *H10K 59/131* (2023.02); *G09G 2300/0842* (2013.01); *G09G 2320/0233* (2013.01); *G09G 2330/00* (2013.01); *G09G 2330/12* (2013.01); *G09G 2360/145* (2013.01)

(58) Field of Classification Search
CPC ................. G09G 3/006; G09G 3/3233; G09G 2300/0842; G09G 2320/0233; G09G 2330/00; G09G 2330/12; G09G 2360/145; H10K 59/131

USPC ......................................................... 345/204
See application file for complete search history.

(56) References Cited

U.S. PATENT DOCUMENTS

| | | | | | |
|---|---|---|---|---|---|
| 2004/0085275 A1* | 5/2004 | Sugiyama | .............. | G09G 3/006 | |
| | | | | 345/87 | |
| 2010/0149082 A1* | 6/2010 | Hong | ................... | G09G 3/3611 | |
| | | | | 345/99 | |
| 2010/0156885 A1* | 6/2010 | Cho | ..................... | G09G 3/3666 | |
| | | | | 345/87 | |
| 2012/0056186 A1* | 3/2012 | Shirouzu | ........... | G02F 1/136204 | |
| | | | | 257/E29.273 | |
| 2012/0206465 A1* | 8/2012 | Yang | ........................ | G09G 5/39 | |
| | | | | 345/534 | |
| 2018/0075791 A1* | 3/2018 | Li | ........................... | G09G 3/006 | |
| 2018/0174510 A1* | 6/2018 | Lim | ..................... | H10K 59/131 | |
| 2020/0210010 A1* | 7/2020 | Kim | ..................... | G09G 3/3233 | |
| 2020/0410938 A1* | 12/2020 | Moradi | ................ | G09G 3/3266 | |

(Continued)

*Primary Examiner* — Tom V Sheng

(74) *Attorney, Agent, or Firm* — Morgan, Lewis & Bockius LLP

(57) ABSTRACT

A lighting inspection circuit and a display device including the same are disclosed. A light inspection circuit may include: a mode signal input pad receiving a lighting inspection signal or driving power according to a driving mode of a display device; a lighting inspection switching element transferring the lighting inspection signal to a plurality of lighting inspection lines connected to a plurality of subpixels of the display device when turned on according to the driving mode; and a power supply switching element connected to one end of the lighting inspection switching element and, when turned on according to the driving mode, transferring the driving power applied to the mode signal input pad to a plurality of power supply lines connected to the plurality of subpixels.

21 Claims, 9 Drawing Sheets

(56)  References Cited

U.S. PATENT DOCUMENTS

| | | | |
|---|---|---|---|
| 2022/0157270 A1* | 5/2022 | Wu ..................... | G09G 3/3648 |
| 2023/0074067 A1* | 3/2023 | Yu ..................... | G09G 3/3291 |
| 2023/0206798 A1* | 6/2023 | Kim .................... | G09G 3/2074 |
| | | | 345/694 |

* cited by examiner

LIGHTING INSPECTION CIRCUIT AND DISPLAY DEVICE INCLUDING THE SAME

CROSS-REFERENCE TO RELATED APPLICATION

This application claims priority from Korean Patent Application No. 10-2024-0006256, filed on Jan. 15, 2024, which is hereby incorporated by reference for all purposes as if fully set forth herein.

BACKGROUND

Field

Embodiments of the disclosure relate to a lighting inspection circuit and a display device including the same.

Description of Related Art

In the information society, many related technologies are being developed in the field of display devices for displaying visual information as images or videos. A display device includes a display panel having a display area provided with pixels for displaying images and a non-display area disposed outside the display area not to display images, a gate driving circuit for supplying gate signals to the pixels, a data driving circuit for supplying data voltages to the pixels, and a timing controller for supplying signals for controlling the gate driving circuit and the data driving circuit.

Further, the pixels of the display device have red subpixels, green subpixels, and blue subpixels for representing RGB colors. Further, an auto probe (AP) inspection is performed by applying an inspection signal to each subpixel to identify whether the subpixels are driven so as to inspect an abnormality in driving for each subpixel.

Since a circuit provided for auto probe inspection is used only for auto probe inspection before the display device is shipped out, the efficiency of use is low relative to the occupied area.

SUMMARY

Accordingly, the present disclosure is directed to a lighting inspection circuit and a display device including the same that substantially obviate one or more of the problems due to limitations and disadvantages of the related art.

Embodiments of the disclosure may provide a display device that implements component sharing by connecting a circuit for lighting inspection in a compatible manner according to the driving mode.

The objects of the present disclosure are not limited to the above-described objects, and other objects not mentioned can be clearly understood by those skilled in the art from the following description.

To achieve these objects and other advantages of the present disclosure, as embodied and broadly described herein, a display device according to embodiments of the disclosure may comprise a display panel including a display area where a plurality of subpixels displaying an image are positioned and a non-display area displaying no image outside the display area, a plurality of lighting inspection lines connected with the plurality of subpixels along a pixel column for each color, a plurality of driving power supply lines supplying driving power to the plurality of subpixels, and an inspection circuit provided in the non-display area and performing lighting inspection on the display panel. The inspection circuit may include a mode signal input pad receiving a lighting inspection signal or driving power according to a driving mode of the display device, a lighting inspection switching element transferring the lighting inspection signal to the plurality of lighting inspection lines when turned on according to the driving mode, and a power supply switching element connected to one end of the lighting inspection switching element and transferring the driving power applied to the mode signal input pad to the plurality of driving power supply lines when turned on according to the driving mode.

In another aspect of the present disclosure, a lighting inspection circuit according to embodiments of the disclosure may comprise a mode signal input pad receiving a lighting inspection signal or driving power according to a driving mode of a display device, a lighting inspection switching element transferring the lighting inspection signal to a plurality of lighting inspection lines connected to a plurality of subpixels of the display device when turned on according to the driving mode, and a power supply switching element connected to one end of the lighting inspection switching element and, when turned on according to the driving mode, transferring the driving power applied to the mode signal input pad to a plurality of power supply lines connected to the plurality of subpixels.

According to embodiments of the disclosure, it is possible to switch and use a lighting inspection circuit for each driving mode by connecting the lighting inspection circuit in a compatible manner according to the driving mode.

According to embodiments of the disclosure, a circuit for lighting inspection may be used in each of a lighting inspection mode and a module driving mode, thereby implementing component sharing. Thus, it is possible to lighten the display device by increasing the use efficiency relative to the area occupied by the lighting inspection circuit as compared with the conventional art.

According to embodiments of the disclosure, it is possible to reduce the size of the non-display area (bezel) of the display panel through component sharing for using the lighting inspection circuit in the lighting inspection mode and module driving mode.

According to embodiments of the disclosure, it is possible to eliminate the need for a dedicated circuit for each of the lighting inspection mode and the module driving mode in the display panel through component sharing for using a lighting inspection circuit for the lighting inspection mode in the module driving mode. Thus, it is possible to lighten the display panel.

The advantages and effects according to the present disclosure are not limited to those described above, and additional advantages and effects are included in or may be obtained from the present disclosure.

Additional features and aspects of the disclosure will be set forth in the description that follows and in part will become apparent from the description or may be learned by practice of the inventive concepts provided herein. Other features and aspects of the inventive concepts may be realized and attained by the structure particularly pointed out in, or derivable from, the written description, claims hereof, and the appended drawings.

It is to be understood that both the foregoing general description and the following detailed description of the present disclosure are by way of example and are intended to provide further explanation of the disclosures as claimed.

BRIEF DESCRIPTION OF DRAWINGS

The accompanying drawings, which are included to provide a further understanding of the disclosure and are incorporated in and constitute a part of this application, illustrate example embodiments of the disclosure and together with the description serve to explain the principles of the disclosure. In the drawings.

DETAILED DESCRIPTION

Figure 1:
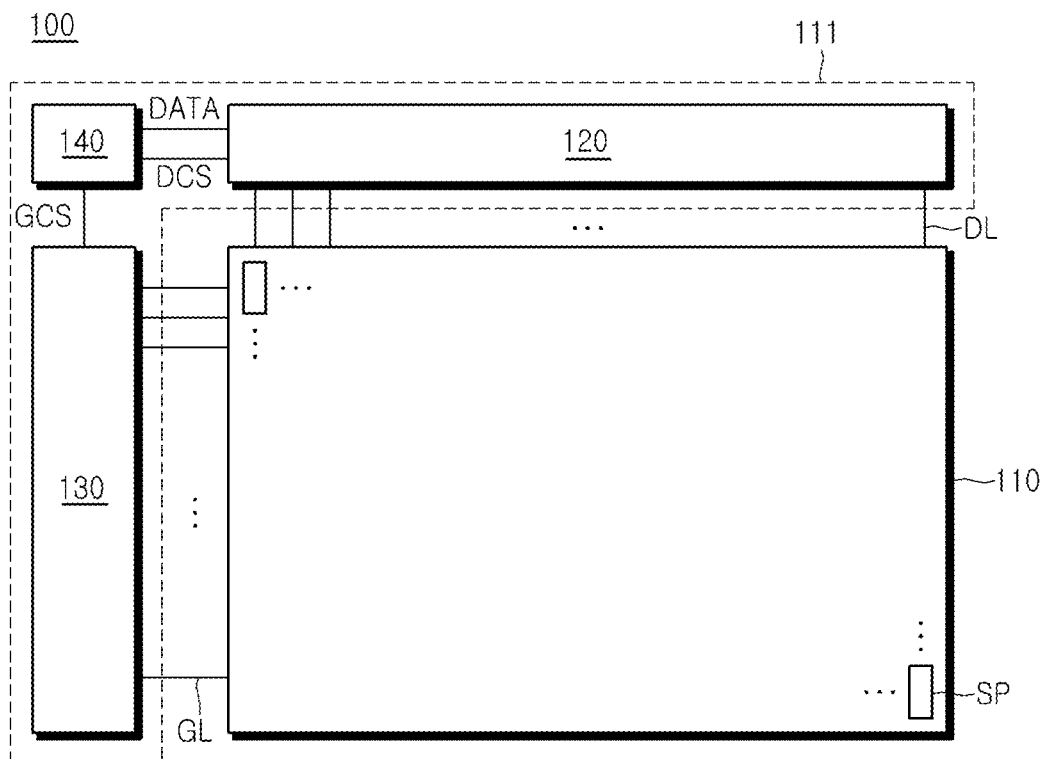
FIG. 1 is a view illustrating a system configuration of a display device according to embodiments of the disclosure.

In the following description of examples or embodiments of the disclosure, reference will be made to the accompanying drawings in which specific examples or embodiments that can be implemented are shown by way of illustration, and in which the same reference numerals and signs can be used to designate the same or like components even when they are shown in different accompanying drawings from one another. The present disclosure may, however, be embodied in different forms and should not be construed as limited to the example embodiments set forth herein. Rather, these example embodiments are provided so that this disclosure will be thorough and complete and will fully convey the scope of the present disclosure to those skilled in the art.

In the following description, where a detailed description of a relevant known function or configuration may unnecessarily obscure aspects of the present disclosure, a detailed description of such a known function or configuration may be omitted or be briefly discussed.

Where a term like "include," "have," "contain," "constitute," "make up of," or "formed of" is used, one or more other elements may be added unless the term is used with a more limiting term, such as "only." An element described in a singular form may include a plurality of elements, and vice versa, unless the context clearly indicates otherwise.

Although terms "first," "second," "A," "B," "(A)," "(B)," and the like may be used herein to describe various elements, these elements should not be interpreted to be limited by these terms as they are not used to define a particular essence, order, sequence, precedence, or number of such elements. These terms are used only to refer one element separately from another. For example, a first element could be termed a second element, and a second element could similarly be termed a first element, without departing from the scope of the present disclosure.

Where a description is provided that a first element "is connected or coupled to," "contacts or overlaps" a second element, or the like, it should be interpreted that, not only can the first element "be directly connected or coupled to" or "directly contact or overlap" the second element, but a third element can also be "interposed" between the first and second elements, or the first and second elements can "be connected or coupled to," "contact or overlap," each other via a fourth element. Here, the second element may be included in at least one of two or more elements that "are connected or coupled to," "contact or overlap," each other.

Where time relative terms, such as "after," "subsequent to," "next," "before," and the like, are used to describe processes or operations of elements or configurations, or flows or steps in operating, processing, or manufacturing methods, these terms may be used to describe non-consecutive or non-sequential processes or operations unless the terms are used with a more limiting term like "directly" or "immediately."

In addition, where any dimensions, relative sizes, and the like, are described, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure are described in detail with reference to the accompanying drawings.

FIG. 1 is a view schematically illustrating a system configuration of a display device according to embodiments of the disclosure.

As shown in FIG. 1, a display device 100 according to the present embodiments may include a display panel 110 where a plurality of data lines DL and a plurality of gate lines GL are arranged, and a plurality of subpixels SP defined by the plurality of data lines DL and the plurality of gate lines GL are arranged in a matrix type and a driving circuit 111 for driving the display panel 110.

From a functional point of view, the driving circuit 111 may include a data driving circuit 120 driving the plurality of data lines DL, a gate driving circuit 130 driving the plurality of gate lines GL, and a controller 140 controlling the data driving circuit 120 and the gate driving circuit 130.

In the display panel 110, the plurality of data lines DL and the plurality of gate lines GL may be disposed to cross each other. For example, the plurality of gate lines GL may be arranged in rows or columns, and the plurality of data lines DL may be arranged in columns or rows. For ease of description, it is assumed below that the plurality of gate lines GL are arranged in rows, and the plurality of data lines DL are arranged in columns.

In the display panel 110, other types of lines such as driving power supply lines, in addition to the plurality of data lines DL and the plurality of gate lines GL, may be disposed.

The controller 140 may supply image data DATA to the data driving circuit 120.

Further, the controller 140 may control the operation of the data driving circuit 120 and the gate driving circuit 130 by supplying various control signals DCS and GCS necessary for the driving operation of the data driving circuit 120 and the gate driving circuit 130.

The controller 140 starts scanning according to a timing implemented in each frame, converts input image data input from the outside into image data DATA suited for the data signal format used in the data driving circuit 120, outputs the image data DATA, and controls data driving at an appropriate time suited for scanning.

To control the data driving circuit 120 and gate driving circuit 130, the controller 140 receives timing signals, such as a vertical sync signal (Vsync), horizontal sync signal (Hsync), input data enable signal (Data Enable, DE), or clock signal (CLK) form the outside (e.g., a host system), generate various control signals, and outputs the control signals to the data driving circuit 120 and gate driving circuit 130.

As an example, to control the gate driving circuit 130, the controller 140 outputs various gate control signals GCS including a gate start pulse (GSP), a gate shift clock (GSC), and a gate output enable signal (Gate Output Enable, GOE).

To control the data driving circuit 120, the controller 140 outputs various data control signals DCS including, e.g., a source start pulse (SSP), a source sampling clock (SSC), and a source output enable signal (Source Output Enable, SOE).

The controller 140 may be a timing controller used in typical display technology, or a control device that may perform other control functions as well as the functions of the timing controller.

The controller 140 may be implemented as a separate component from the data driving circuit 120, or the controller 140, along with the data driving circuit 120, may be implemented as an integrated circuit.

The data driving circuit 120 receives the image data DATA from the controller 140 and supply data voltage to the plurality of data lines DL, thereby driving the plurality of data lines DL. Here, data driving circuit 120 is also referred to as a 'source driving circuit' or 'source drive IC'.

The data driving circuit 120 may include a shift register, a latch circuit, a digital-to-analog converter (DAC), and an output buffer.

In some cases, the data driving circuit 120 may further include one or more analog-digital converters (ADC).

The gate driving circuit 130 sequentially drives the plurality of gate lines GL by sequentially supplying scan signals to the plurality of gate lines GL. Here, gate driving circuit 130 is also referred to as a 'scan driving circuit.'

The gate driving circuit 130 may include, e.g., a shift register and a level shifter.

The gate driving circuit 130 sequentially supplies scan signals of On voltage or Off voltage to the plurality of gate lines GL under the control of the controller 140.

When a specific gate line is opened by the gate driving circuit 130, the data driving circuit 120 converts the image data DATA received from the controller 140 into an analog data voltage and supplies the analog data voltage to the plurality of data lines DL.

The data driving circuit 120 may be positioned on only one side (e.g., the top or bottom side) of the display panel 110 and, in some cases, the data driving circuit 120 may be positioned on each of two opposite sides (e.g., both the top and bottom sides) of the display panel 110 depending on, e.g., driving schemes or panel designs.

The gate driving circuit 130 may be positioned on only one side (e.g., the left or right side) of the display panel 110 and, in some cases, the gate driving circuit 130 may be positioned on each of two opposite sides (e.g., both the left and right sides) of the display panel 110 depending on, e.g., driving schemes or panel designs.

The data driving circuit 120 may include at least one source driver integrated circuit SDIC.

Each source driver integrated circuit SDIC may be connected, in a tape automated bonding (TAB) type or chip-on-glass (COG) type, to the bonding pad of the display panel 110 or may be disposed directly on the display panel 110. In some cases, each source driver integrated circuit (SDIC may be integrated and disposed on the display panel 110. Each source driver integrated circuit SDIC may be implemented in a chip-on-film (COF) type. In this case, each source driver integrated circuit (SDIC) may be mounted on a circuit film and be electrically connected with the data lines DL of the display panel 110 through the circuit film.

In the gate driving circuit 130, one or more gate driver integrated circuits (ICs) GDIC may be connected to the bonding pad of the display panel 110 in a TAB or COG type. Further, the gate driving circuit 130 may be implemented in a gate-in-panel (GIP) type and be directly disposed on the display panel 110. Further, the gate driving circuit 130 may be implemented in a chip-on-film (COF) type. In this case, each gate driver integrated circuit GDIC included in the gate driving circuit 130 may be mounted on a circuit film and be electrically connected with the gate lines GL of the display panel 110 through the circuit film.

Figure 2:
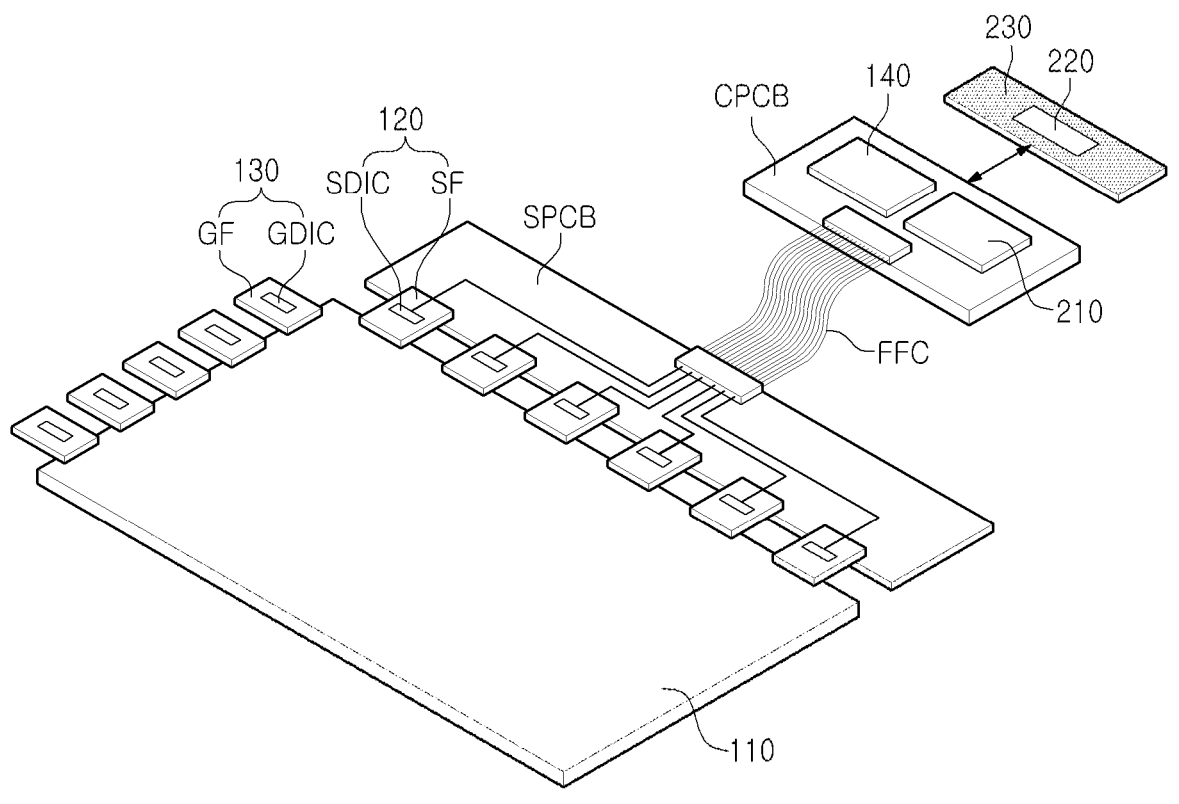
FIG. 2 illustrates an example of system implementation of a display device according to embodiments of the disclosure.

FIG. 2 is a view illustrating an example of system implementation of a display device according to embodiments of the disclosure.

FIG. 2 illustrates an example in which each source driver integrated circuit SDIC included in the data driving circuit 120 is implemented in a chip-on-film (COF) type among various types (e.g., TAB, COG, and COF), and the gate driving circuit 130 is implemented in a gate-in-panel (GIP) type among various types (e.g., TAB, COG, COF, and GIP).

Each of the plurality of source driver integrated circuits SDIC included in the data driving circuit 120 may be mounted on the source-side circuit film SF.

One side of the source-side circuit film SF may be electrically connected with the display panel 110.

Lines for electrically connecting the source driver integrated circuit SDIC and the display panel 110 may be disposed on the source-side circuit film SF.

The display device 100 may include at least one source printed circuit board SPCB for circuit connection between a plurality of source driver integrated circuits SDIC and other devices and a control printed circuit board CPCB for mounting control components and various electric devices.

The other side of the source-side circuit film SF on which the source driver integrated circuit SDIC is mounted may be connected to the at least one source printed circuit board SPCB.

In other words, one side of the source-side circuit film SF where the source driver integrated circuit SDIC is mounted may be electrically connected with the display panel 110, and the other side thereof may be electrically connected with the source printed circuit board SPCB.

A controller 140 for controlling the operation of, e.g., the data driving circuit 120 and the gate driving circuit 130 and a power management integrated circuit (PMIC) 210 for supplying various voltages or currents to, e.g., the display panel 110, the data driving circuit 120, and the gate driving circuit 130 or controlling various voltages or currents to be supplied may be mounted on the control printed circuit board CPCB.

At least one source printed circuit board SPCB and the control printed circuit board CPCB may be circuit-connected through at least one connection member. Here, the connection member may be, e.g., a flexible printed circuit (FPC) or a flexible flat cable (FFC).

At least one source printed circuit board SPCB and control printed circuit board CPCB may be integrated into one printed circuit board.

The display device 100 may further include a set board 230 electrically connected with the control printed circuit board CPCB. The set board 230 may also be referred to as a power board.

A main power management circuit (M-PMC) 220 for managing the overall power of the display device 100 may be disposed on the set board 230.

The power management integrated circuit 210 is a circuit that manages power for a display module including the display panel 110 and its driving circuits 120, 130, and 140, and the main power management circuit 220 is a circuit that manages the power of the whole including the display module, and may interwork with the power management integrated circuit 210.

Each of the subpixels SP arranged on the display panel 110 included in the display device 100 according to the present embodiments may include an organic light emitting diode (OLED) which is a self-emissive element and a circuit element, e.g., a driving transistor, for driving the organic light emitting diode (OLED).

The type and number of circuit elements constituting each subpixel SP may be varied depending on functions to be provided and design schemes.

Figure 3:
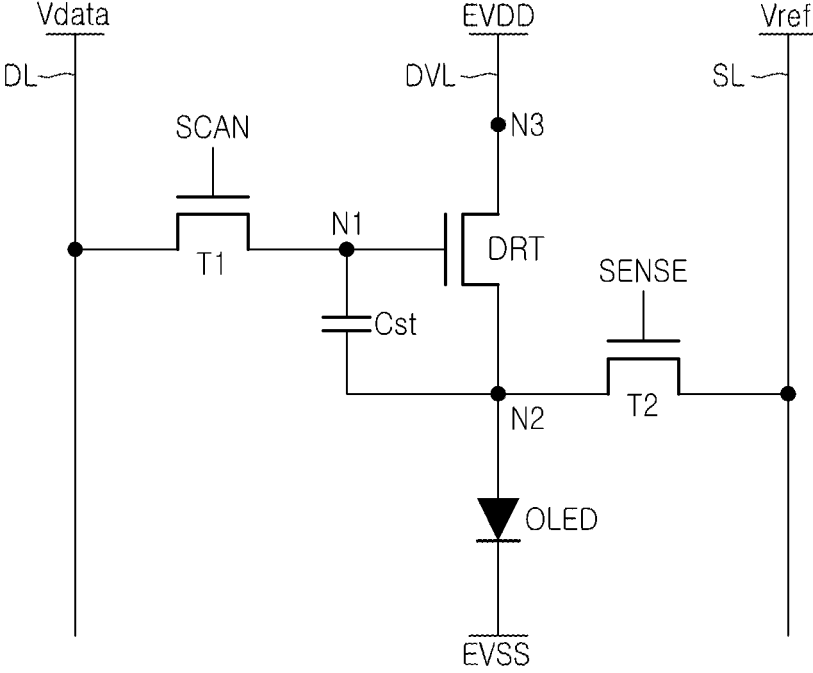
FIG. 3 illustrates a circuit of a subpixel of a display panel according to embodiments of the disclosure.

FIG. 3 illustrates a circuit of a subpixel of a display panel according to embodiments of the disclosure.

A plurality of data lines DL, a plurality of gate lines GL, a plurality of driving voltage lines DVL, and a plurality of sensing lines SL may be disposed on the display panel 110 according to embodiments of the disclosure.

Each subpixel SP in the display panel 110 may be implemented to include an organic light emitting diode OLED, a driving transistor DRT for driving the organic light emitting diode OLED, a first transistor T1 electrically connected between a first node N1 of the driving transistor DRT and a corresponding data line DL, a second transistor T2 electrically connected between a second node N2 of the driving transistor DRT and a corresponding sensing line SL among a plurality of sensing lines SL, and a storage capacitor Cst electrically connected between the first node N1 and the second node N2 of the driving transistor DRT.

The organic light emitting diode OLED may include an anode electrode, an organic light emitting layer, and a cathode electrode.

According to the circuit example of FIG. 3, the anode electrode of the organic light emitting diode OLED may be electrically connected to the second node N2 of the driving transistor DRT. A low-potential driving voltage Vss may be applied to the cathode electrode of the organic light emitting diode OLED.

Here, the low-potential driving voltage Vss may be, e.g., a ground voltage or a voltage higher or lower than the ground voltage. Further, a base voltage EVSS may vary according to a driving state. For example, the low-potential driving voltage Vss during image driving and the low-potential driving voltage Vss during sensing driving may be set to differ from each other.

The driving transistor DRT drives the organic light emitting diode OLED by supplying a driving current to the organic light emitting diode OLED.

The driving transistor DRT may include a first node N1, a second node N2, a third node N3, and the like.

The first node N1 of the driving transistor DRT may be the gate node, and may be electrically connected to the source node or the drain node of the first transistor T1. The second node N2 of the driving transistor DRT may be the source node or the drain node, may be electrically connected to the anode electrode (or the cathode electrode) of the organic light emitting diode OLED, and may also be electrically connected to the source node or the drain node of the second transistor T2. The third node N3 of the driving transistor DRT may be the drain node or the source node, may receive the high-potential driving voltage Vdd, and may be electrically connected to the driving voltage line DVL supplying the high-potential driving voltage Vdd. Hereinafter, for convenience of description, in the driving transistor DRT, the first node N1 may be the gate node, the second node N2 may be the source node, and the third node N3 may be the drain node.

The storage capacitor Cst may be electrically connected between the first node N1 and the second node N2 of the driving transistor DRT to maintain the data voltage Vdata corresponding to the image signal voltage or the voltage corresponding thereto for one frame time (or a predetermined time).

The drain node or the source node of the first transistor T1 may be electrically connected to the corresponding data line DL, the source node or the drain node of the first transistor T1 may be electrically connected to the first node N1 of the driving transistor DRT, and the gate node of the first transistor T1 may be electrically connected to the corresponding gate line to receive the scan signal SCAN.

The first transistor T1 may be controlled to be turned on and off by receiving the scan signal SCAN to the gate node through the corresponding gate line.

The first transistor T1 may be turned on by the scan signal SCAN to transfer the data voltage Vdata supplied from the corresponding data line DL to the first node N1 of the driving transistor DRT.

The drain node or the source node of the second transistor T2 may be electrically connected to the sensing line SL, and the source node or the drain node of the second transistor T2 may be electrically connected to the second node N2 of the driving transistor DRT. The gate node of the second transistor T2 may be electrically connected to the corresponding gate line to receive the sense signal SENSE.

The second transistor T2 may be controlled to be turned on and off by receiving the sense signal SENSE to the gate node through the corresponding gate line.

The second transistor T2 may be turned on by the sense signal SENSE to transfer the reference voltage Vref supplied from the corresponding sensing line SL to the second node N2 of the driving transistor DRT.

Meanwhile, the storage capacitor Cst may be an external capacitor intentionally designed to be outside the driving transistor DRT, but not a parasite capacitor (e.g., Cgs or Cgd) which is an internal capacitor present between the first node N1 and the second node N2 of the driving transistor DRT.

Each of the driving transistor DRT, the first transistor T1, and the second transistor T2 may be a n-type transistor or p-type transistor.

Meanwhile, the scan signal SCAN and the sense signal SENSE may be separate gate signals. In this case, the scan signal SCAN and the sense signal SENSE may be applied to the gate node of the first transistor T1 and the gate node of the second transistor T2, respectively, through different gate lines.

In some cases, the scan signal SCAN and the sense signal SENSE may be the same gate signal. In this case, the scan signal SCAN and the sense signal SENSE may be jointly applied to the gate node of the first transistor T1 and the gate node of the second transistor T2 through the same gate line.

The structure of each subpixel exemplified in FIG. 3 is a 3T (transistor) 1C (capacitor) structure, which is merely an example for description, and may further include one or more transistors or, in some cases, one or more capacitors. The plurality of subpixels may have the same structure, or some of the plurality of subpixels may have a different structure.

Hereinafter, an image driving operation of each subpixel SP will be briefly described as an example.

The display driving (also referred to as image driving) operation of each subpixel SP may be performed in an image data writing step, a boosting step, and a light emitting step.

In the image data writing step, the image driving data voltage Vdata corresponding to the image signal may be applied to the first node N1 of the driving transistor DRT, and the reference voltage Vref for image driving may be applied to the second node N2 of the driving transistor DRT. Here, a voltage Vref' similar to the reference voltage Vref may be applied to the second node N2 of the driving transistor DRT due to a resistance component between the second node N2 of the driving transistor DRT and the sensing line SL. The reference voltage Vref for image driving is also referred to as VpreR.

In the image data writing step, the first transistor T1 and the second transistor T2 may be turned on at the same time or with a slight time difference.

In the image data writing step, the storage capacitor Cst may be charged with an electric charge corresponding to a-potential difference Vdata-Vref or Vdata-Vref' between two opposite ends thereof.

The application of the image driving data voltage Vdata to the first node N1 of the driving transistor DRT is referred to as image data writing.

In the boosting step following the image data writing step, the first node N1 and the second node N2 of the driving transistor DRT may be electrically floated simultaneously or with a slight time difference.

To that end, the first transistor T1 may be turned off by the turn-off level voltage of the scan signal SCAN. Further, the second transistor T2 may be turned off by the turn-off level voltage of the sense signal SENSE.

In the boosting step, the voltage difference between the first node N1 and the second node N2 of the driving transistor DRT may be maintained, and the voltage of each of the first node N1 and the second node N2 of the driving transistor DRT may be boosted.

During the boosting step, the voltage of each of the first node N1 and the second node N2 of the driving transistor DRT is boosted, and when the increased voltage of the second node N2 of the driving transistor DRT is equal to or higher than a predetermined voltage (i.e., a voltage capable of turning on the organic light emitting diode OLED, which is higher than the low-potential driving voltage Vss by the threshold voltage of the organic light emitting diode OLED), the light emitting step is entered.

In this light emitting step, a driving current flows through the organic light emitting diode OLED. Accordingly, the organic light emitting diode OLED may emit light.

The driving transistor DRT disposed in each of the plurality of subpixels SP arranged on the display panel 110 according to embodiments of the disclosure has the unique characteristic values such as the threshold voltage and mobility (also referred to as electronic mobility).

The driving transistor DRT may deteriorate according to the driving time. Accordingly, the unique characteristic values of the driving transistor DRT may vary according to the driving time.

The on-off timings of the driving transistor DRT may vary or the driving capability of the organic light emitting diode OLED may vary according to a change in the characteristic value. In other words, in the driving transistor DRT, the timing when the current is supplied to the organic light emitting diode OLED and the amount of current supplied to the organic light emitting diode OLED may vary according to the change in the characteristic value. According to the change in the characteristic value of the driving transistor DRT, the actual luminance of the corresponding subpixel SP may be different from a desired luminance.

Further, the plurality of subpixels SP arranged on the display panel 110 may have different driving times. Accordingly, a characteristic value deviation (threshold voltage deviation, mobility deviation) between the driving transistors DRT in each subpixel SP may occur.

The characteristic value deviation between the driving transistors DRT may generate a luminance deviation between the subpixels SP. Accordingly, the luminance uniformity of the display panel 110 may also deteriorate, which may eventually lead to poor image quality.

Accordingly, the display device 100 may include a compensation circuit capable of compensating for deviation of characteristic values between the driving transistors DRTs, and may provide a compensation method using the compensation circuit.

Figure 4:
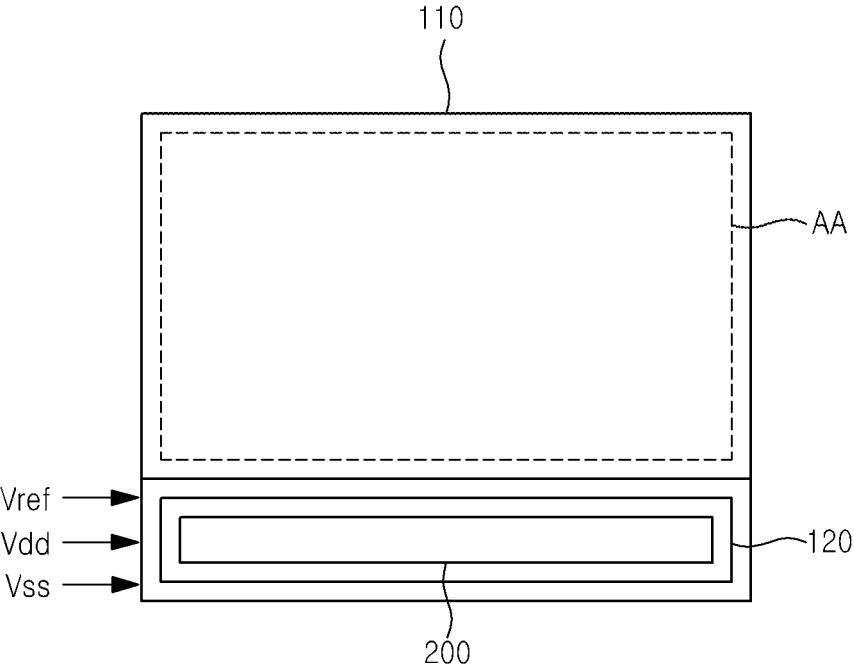
FIG. 4 is a plan view illustrating a display panel, a source drive IC, and a lighting inspection circuit of a display device according to an embodiment of the disclosure.
Figure 7:
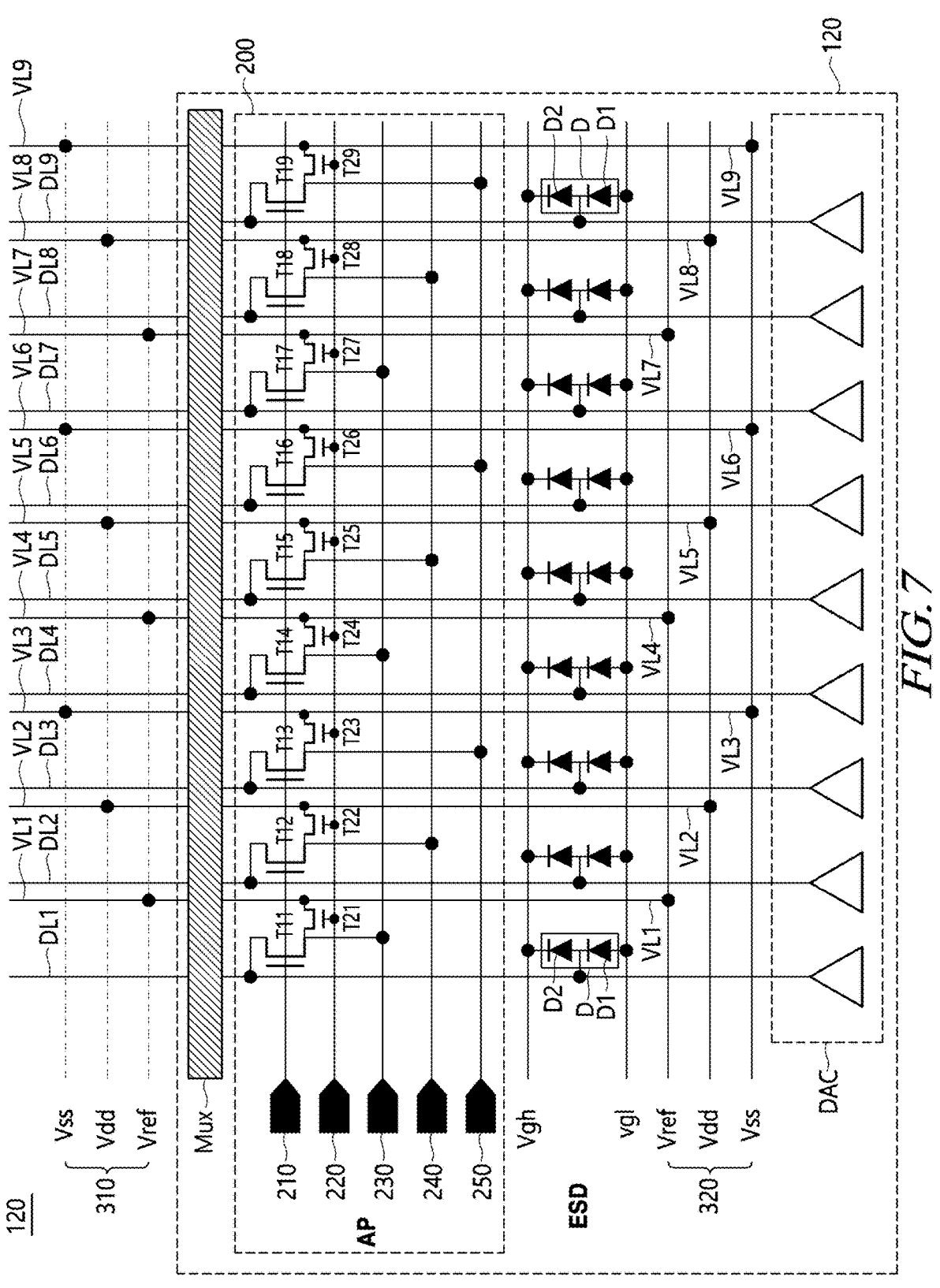
FIG. 7 is a circuit diagram illustrating, in detail, the lighting inspection circuit of FIG. 4.

FIG. 4 is a plan view illustrating a schematic configuration of a display device according to an embodiment of the disclosure, and FIG. 7 is a circuit diagram illustrating a display device according to an embodiment of the disclosure.

As shown in FIG. 4, the display device 100 includes a display panel 110, a source drive IC 120, and a lighting inspection circuit 200.

The lighting inspection circuit 200 may be disposed in an outer area of the display area AA on the display panel 110. The lighting inspection circuit 200 may be included in the source drive IC 120. Alternatively, the lighting inspection circuit 200 may be disposed outside the source drive IC 120 and may be disposed on pads or a pad on which bumps for receiving or supplying an electrical signal from the source drive IC 120 are formed.

As shown in FIG. 7, the reference voltage Vref, the high-potential driving voltage Vdd, and the low-potential driving voltage Vss for driving the plurality of pixels from the first power supply unit or circuit 310 may be supplied to the display panel 110 through the driving power supply lines VL1 to VL9.

Further, the reference voltage Vref, the high-potential driving voltage Vdd, and the low-potential driving voltage Vss for driving the plurality of pixels from the second power supply unit or circuit 320 may be supplied to the display panel 110 through the driving power supply lines VL1 to VL9.

Here, both the first power supply unit 310 and the second power supply unit 320 may be provided, or only one of them may be provided.

Further, the reference voltage Vref, the high-potential driving voltage Vdd, and the low-potential driving voltage Vss may be transferred to the driving power supply lines VL1 to VL9 through the power supply switching elements T21 to T29 from the mode signal input pads 230 to 250 provided to be compatible according to the driving mode of the display panel 110 and supplied to the display panel 110.

Specifically, when the driving mode is the module driving mode MODULE, the reference voltage Vref, high-potential driving voltage Vdd, and low-potential driving voltage Vss applied to the mode signal input pads 230 to 250 may be transferred to the driving power supply lines VL1 to VL9 through the turned-on power supply switching elements T21 to T29 and be supplied to the display panel 110.

In this case, the driving power supplied from the mode signal input pads 230 to 250 may be referred to as auxiliary driving power supplied in addition to the driving power supplied from the first power supply unit 310 or the second power supply unit 320. In this case, the driving power supplied from the first power supply unit 310 or the second power supply unit 320 may be referred to as main driving power.

As such, as the main driving power is supplied to the display panel 110 through the first power supply unit 310 or the second power supply unit 320, and the auxiliary driving power is supplied to the display panel 110 through the mode signal input pads 230 to 250, reliability of the driving power supplied to the display panel 110 may be increased. This is described in detail with reference to FIG. 9.

As shown in FIG. 7, first sides of the driving power supply lines VL1 to VL9 may be connected to the first power supply unit or circuit 310 to supply the driving voltages Vref, Vdd, and Vss supplied from the first power supply unit 310 to the display panel 110. Further, second sides of the driving power supply lines VL1 to VL9 may be connected to the second power supply unit or circuit 320 to supply the driving voltages Vref, Vdd, and Vss supplied from the second power supply unit 320 to the display panel 110. Further, the driving power supply lines VL1 to VL9 may be connected one-to-one with the source nodes or the drain nodes of the power supply switching elements T21 to T29.

The first power supply unit 310 and the second power supply unit 320 each may supply at least one of the reference voltage Vref, the high-potential driving voltage Vdd, and the low-potential driving voltage Vss.

The first power supply unit 310 and the second power supply unit 320 may be connected to one common power supply source (not shown) supplying each driving power Vref, Vdd, and Vss. Alternatively, the first power supply unit 310 may be connected to a first power supply source (not shown) supplying each driving power Vref, Vdd, and Vss, and the second power supply unit 320 may be connected to a second power supply source (not shown) supplying each driving power Vref, Vdd, and Vss. In this case, the first power supply source and the second power supply source may be different driving power supply sources.

Figure 5:
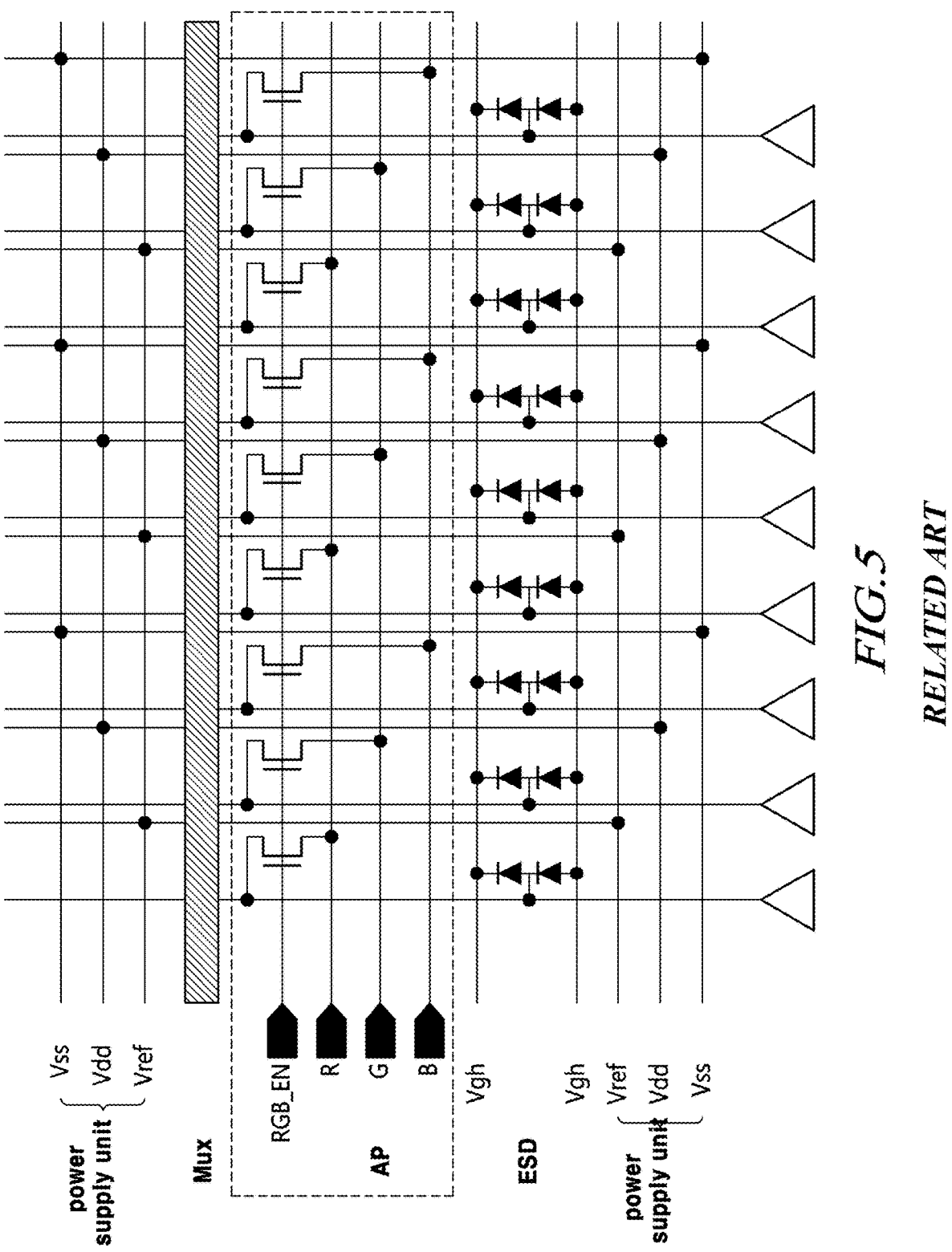
FIG. 5 is a circuit diagram illustrating a related art lighting inspection circuit.
Figure 6:
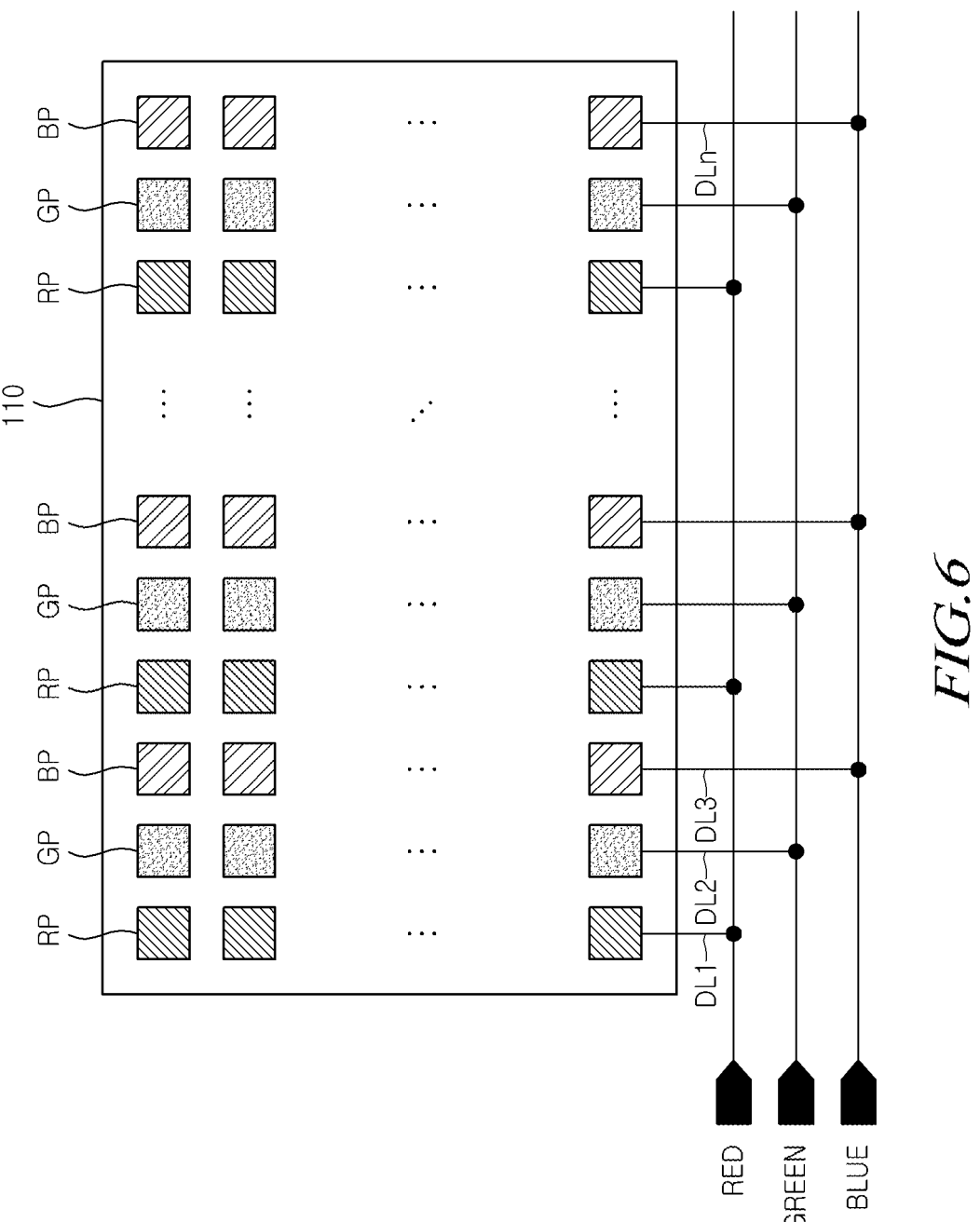
FIG. 6 is a circuit diagram illustrating lighting inspection driving of a lighting inspection circuit.

FIG. 5 is a circuit diagram illustrating a conventional lighting inspection circuit, FIG. 6 is a circuit diagram schematically illustrating driving of a lighting inspection circuit, and FIG. 7 is a circuit diagram illustrating, in detail, the lighting inspection circuit of FIG. 4.

As shown in FIG. 7, the lighting inspection circuit 200 according to embodiments of the disclosure may include a plurality of lighting inspection lines DL1 to DL9, a plurality of mode signal input pads 230 to 250, a plurality of lighting inspection switching elements T11 to T19, a plurality of power supply switching elements T21 to T29, a lighting inspection pad 210, and a power supply pad 220.

Optionally, the lighting inspection circuit 200 may further include a selection drive unit Mux and an anti-static circuit ESD. The selection drive unit may also be called a selection driver, a selection circuit, a Mux unit, or a multiplexing circuit.

As shown in FIG. 6, the plurality of lighting inspection lines DL1 to DL9 may be connected to the plurality of subpixels RP, GP, and BP disposed on the display panel 110.

Specifically, the red subpixel RP, the green subpixel GP, and the blue subpixel BP are disposed on the display panel 110. The red subpixel RP, the green subpixel GP, and the blue subpixel BP are repeatedly arranged in the row direction in the order of the red subpixel RP, the green subpixel GP, and the blue subpixel BP so as to express the colors of RGB in the row direction.

The red subpixels RP, the green subpixels GP, and the blue subpixels BP are disposed while forming pixel columns with the same colors in the column direction. A red lighting inspection line DL1, a green lighting inspection line DL2, and a blue lighting inspection line DL3 connected from the display panel 110 are disposed on the source drive IC 120 outside the display panel 110. Here, the red lighting inspection line DL1, the green lighting inspection line DL2, and the blue lighting inspection line DL3 may be data lines.

As shown in FIG. 7, the lighting inspection circuit 200 includes a plurality of lighting inspection switching elements T11 to T19 to perform lighting inspection (or auto probe inspection). A plurality of lighting inspection switching elements T11 to T19 may be formed of thin film transistors. The gate node of each of the transistors T11 to T19 provided as the plurality of lighting inspection switching elements T11 to T19 is connected to the lighting inspection pad 210.

The lighting inspection pad 210 may receive a signal for turning on the lighting inspection switching elements T11 to T19 or turning off the lighting inspection switching elements T11 to T19 according to the driving mode determined by the controller 140.

Further, the lighting inspection circuit 200 may include a plurality of power supply switching elements T21 to T29 to perform a module driving mode MODULE for displaying an image on the display panel 110. Each of the plurality of power supply switching elements T21 to T29 may be formed of a thin film transistor. The gate nodes of the respective transistors T21 to T29 constituting the plurality of power supply switching elements T21 to T29 are connected to the power supply pad 220.

Figure 8:
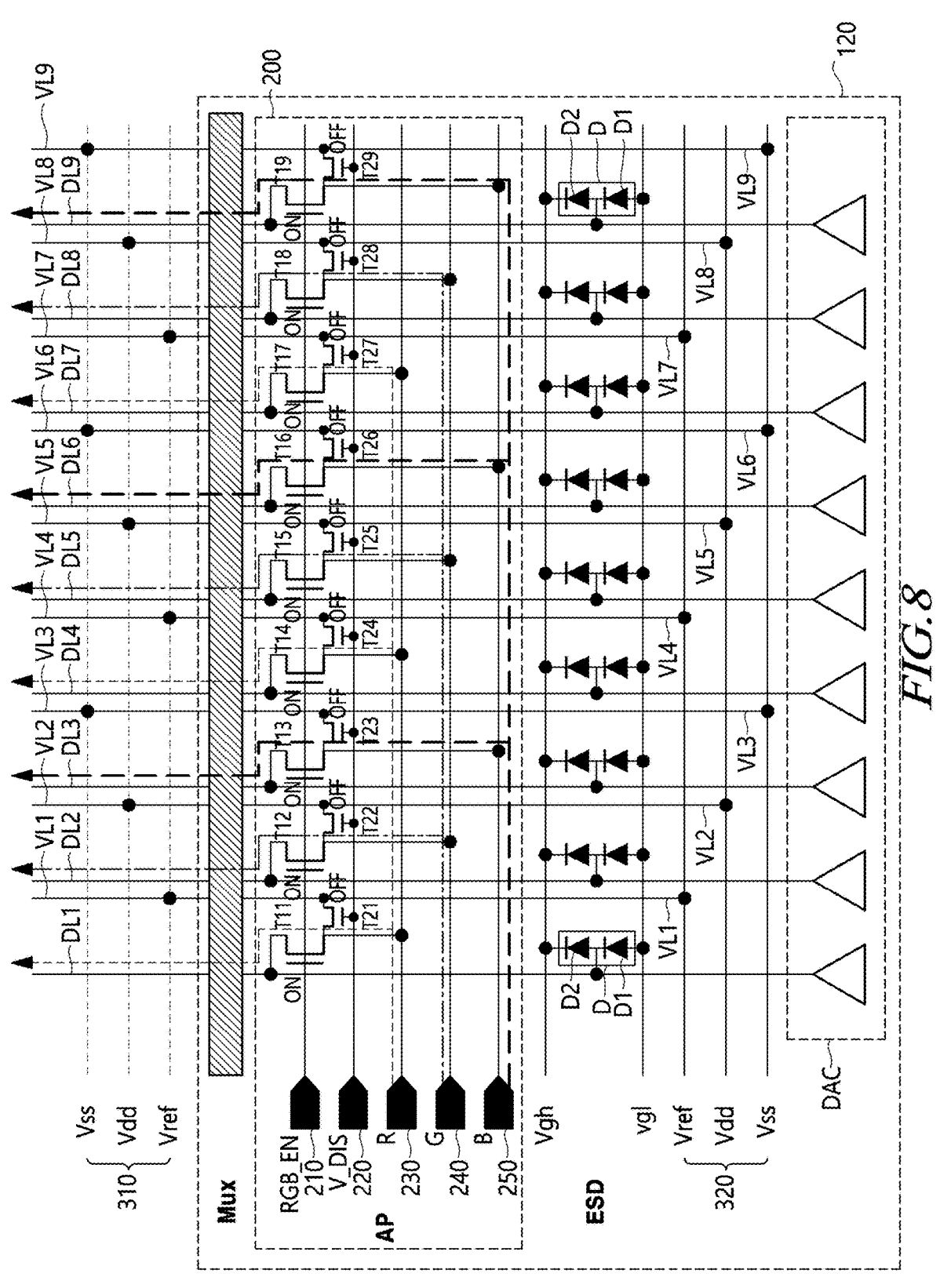
FIG. 8 is a circuit diagram illustrating a lighting inspection mode of a lighting inspection circuit according to an embodiment of the disclosure.

FIG. 8 is a circuit diagram illustrating a lighting inspection mode AP of a lighting inspection circuit according to an embodiment of the disclosure.

As shown in FIG. 8, while the driving mode is the lighting inspection mode AP, the lighting inspection enable signal RGB_EN maintains a high logic level H state.

In the lighting inspection mode AP, the lighting inspection enable signal RGB_EN may be applied to the lighting inspection pad 210, and the plurality of lighting inspection switching elements T11 to T19 may be turned on.

In the lighting inspection mode AP, the red lighting inspection signal R may be applied to the first mode signal input pad 230, the green lighting inspection signal G may be applied to the second mode signal input pad 240, and the blue lighting inspection signal B may be applied to the third mode signal input pad 250.

Accordingly, the lighting inspection of RGB subpixels may be performed collectively using the lighting inspection signals R, G, and B. In this case, a power supply disable signal is applied to the power supply pad 220, and all of the power supply switching elements T21 to T29 are turned off.

Specifically, in the lighting inspection mode AP, the red lighting inspection signal R applied to the first mode signal input pad 230 may be supplied from the source terminal or drain terminal of the first lighting inspection switching element T11 to the red subpixel RP through the first red lighting inspection line DL1 via the drain terminal or source terminal of the first lighting inspection switching element T11.

Further, in the lighting inspection mode AP, the red lighting inspection signal R applied to the first mode signal input pad 230 may be supplied from the source terminal or drain terminal of the fourth lighting inspection switching element T14 to the red subpixel RP through the second red lighting inspection line DL4 via the drain terminal or source terminal of the fourth lighting inspection switching element T14.

Further, in the lighting inspection mode AP, the red lighting inspection signal R applied to the first mode signal input pad 230 may be supplied from the source terminal or drain terminal of the seventh lighting inspection switching element T17 to the red subpixel RP through the third red lighting inspection line DL7 via the drain terminal or source terminal of the seventh lighting inspection switching element T17.

In the lighting inspection mode AP, the green lighting inspection signal G applied to the second mode signal input pad 240 may be supplied from the source terminal or drain terminal of the second lighting inspection switching element T12 to the green subpixel GP through the first green lighting inspection line DL2 via the drain terminal or source terminal of the second lighting inspection switching element T12.

Further, in the lighting inspection mode AP, the green lighting inspection signal G applied to the second mode signal input pad 240 may be supplied from the source terminal or drain terminal of the fifth lighting inspection switching element T15 to the green subpixel GP through the second green lighting inspection line DL5 via the drain terminal or source terminal of the fifth lighting inspection switching element T15.

Further, in the lighting inspection mode AP, the green lighting inspection signal G applied to the second mode signal input pad 240 may be supplied from the source terminal or drain terminal of the eighth lighting inspection switching element T18 to the green subpixel GP through the third green lighting inspection line DL8 via the drain terminal or source terminal of the eighth lighting inspection switching element T18.

In the lighting inspection mode AP, the blue lighting inspection signal B applied to the third mode signal input pad 250 may be supplied from the source terminal or drain terminal of the third lighting inspection switching element T13 to the blue subpixel BP through the first blue lighting inspection line DL3 via the drain terminal or source terminal of the third lighting inspection switching element T13.

Further, in the lighting inspection mode AP, the blue lighting inspection signal B applied to the third mode signal input pad 250 may be supplied from the source terminal or drain terminal of the sixth lighting inspection switching element T16 to the blue subpixel BP through the second blue lighting inspection line DL6 via the drain terminal or source terminal of the sixth lighting inspection switching element T16.

Further, in the lighting inspection mode AP, the blue lighting inspection signal B applied to the third mode signal input pad 250 may be supplied from the source terminal or drain terminal of the ninth lighting inspection switching element T19 to the blue subpixel BP through the third blue lighting inspection line DL9 via the drain terminal or source terminal of the ninth lighting inspection switching element T19.

Figure 9:
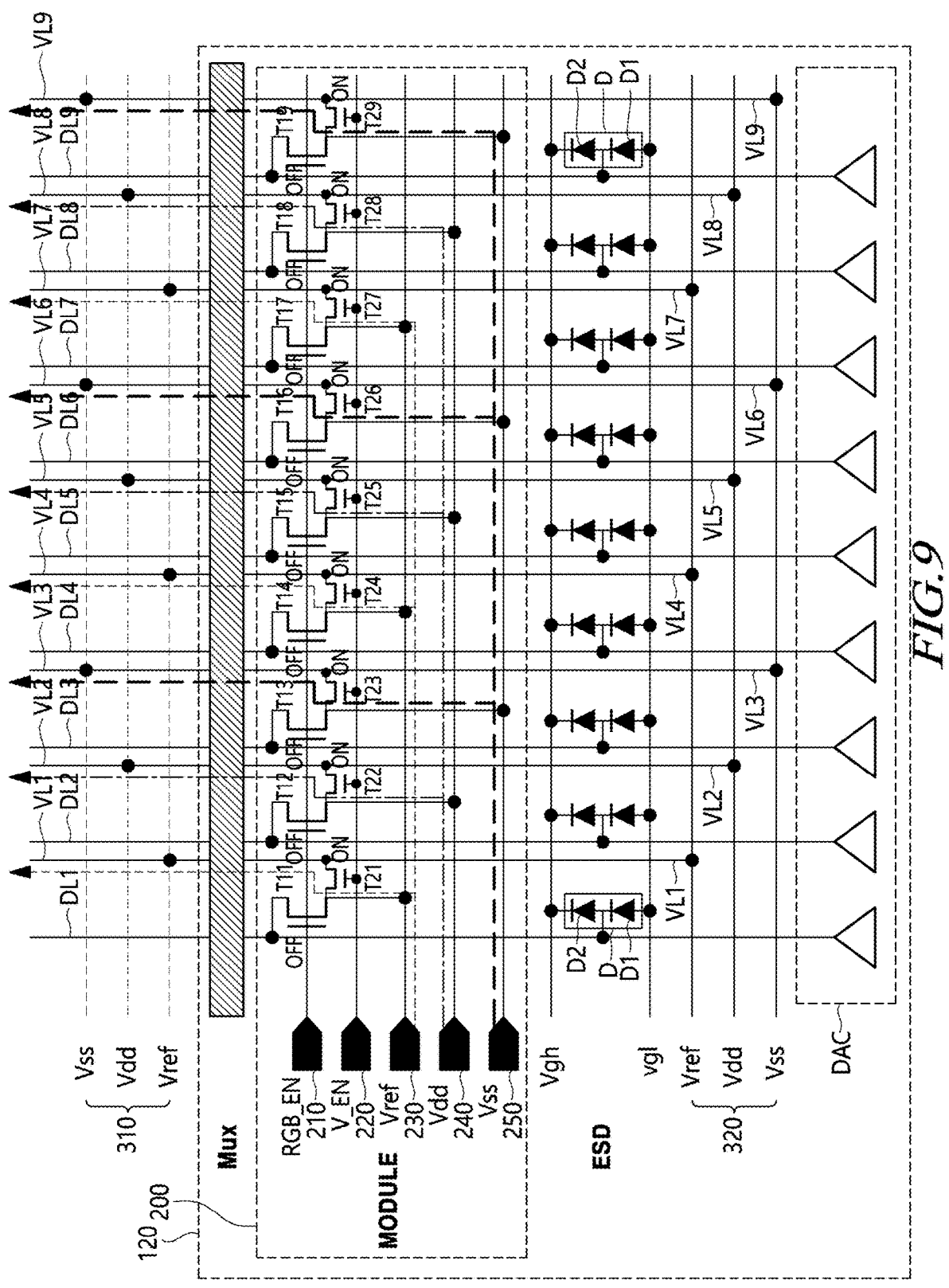
FIG. 9 is a circuit diagram illustrating a module driving mode of a lighting inspection circuit according to an embodiment of the disclosure.

FIG. 9 is a circuit diagram illustrating a module driving mode MODULE of a lighting inspection circuit according to an embodiment of the disclosure.

As shown in FIG. 9, in the module driving mode MOD-ULE, the light inspection enable signal RGB_EN maintains a low logic level L state.

Accordingly, the lighting inspection switching elements T11 to T19 may be turned off, and the lighting inspection lines DL1 to DL9 may be deactivated.

In the module driving mode, the power supply enable signal V_EN may be applied to the power supply pad 220, and the plurality of power supply switching elements T21 to T29 may be turned on.

In the module driving mode, the reference voltage Vref may be applied to the first mode signal input pad 230, the high-potential driving voltage Vdd may be applied to the second mode signal input pad 240, and the low-potential driving voltage Vss may be applied to the third mode signal input pad 250.

In the module driving mode, the reference voltage Vref applied to the first mode signal input pad 230 may be supplied from the source terminal or the drain terminal of the first power supply switching element T21 to at least one subpixel through the first driving power supply line VL1 via the drain terminal or the source terminal of the first power supply switching element T21. The first driving power supply line VL1 may be shared by a plurality of subpixels.

Further, in the module driving mode, the reference voltage Vref applied to the first mode signal input pad 230 may be supplied from the source terminal or the drain terminal of the fourth power supply switching element T24 to at least one subpixel through the fourth driving power supply line VL4 via the drain terminal or the source terminal of the fourth power supply switching element T24. The fourth driving power supply line VL4 may be shared by a plurality of subpixels.

Further, in the module driving mode, the reference voltage Vref applied to the first mode signal input pad 230 may be supplied from the source terminal or the drain terminal of the seventh power supply switching element T27 to at least one subpixel through the seventh driving power supply line VL7 via the drain terminal or the source terminal of the seventh power supply switching element T27. The seventh driving power supply line VL7 may be shared by a plurality of subpixels.

In the module driving mode, the high-potential driving voltage Vdd applied to the second mode signal input pad 240 may be supplied from the source terminal or the drain terminal of the second power supply switching element T22 to at least one subpixel through the second driving power supply line VL2 via the drain terminal or the source terminal of the second power supply switching element T22. The second driving power supply line VL2 may be shared by a plurality of subpixels.

Further, in the module driving mode, the high-potential driving voltage Vdd applied to the second mode signal input pad 240 may be supplied from the source terminal or the drain terminal of the fifth power supply switching element T25 to at least one subpixel through the fifth driving power supply line VL5 via the drain terminal or the source terminal of the fifth power supply switching element T25. The fifth driving power supply line VL5 may be shared by a plurality of subpixels.

Further, in the module driving mode, the high-potential driving voltage Vdd applied to the second mode signal input pad 240 may be supplied from the source terminal or the drain terminal of the eighth power supply switching element T28 to at least one subpixel through the eighth driving power supply line VL8 via the drain terminal or the source terminal of the eighth power supply switching element T28. The eighth driving power supply line VL8 may be shared by a plurality of subpixels.

In the module driving mode, the low-potential driving voltage Vss applied to the third mode signal input pad 250 may be supplied from the source terminal or the drain terminal of the third power supply switching element T23 to at least one subpixel through the third driving power supply line VL3 via the drain terminal or the source terminal of the third power supply switching element T23. The third driving power supply line VL3 may be shared by a plurality of subpixels.

Further, in the module driving mode, the low-potential driving voltage Vss applied to the third mode signal input pad 250 may be supplied from the source terminal or the drain terminal of the sixth power supply switching element T26 to at least one subpixel through the sixth driving power supply line VL6 via the drain terminal or the source terminal of the sixth power supply switching element T26. The sixth driving power supply line VL6 may be shared by multiple subpixels.

Further, in the module driving mode, the low-potential driving voltage Vss applied to the third mode signal input pad 250 may be supplied from the source terminal or the drain terminal of the ninth power supply switching element T29 to at least one subpixel through the ninth driving power supply line VL9 via the drain terminal or the source terminal of the ninth power supply switching element T29. The ninth driving power supply line VL9 may be shared by a plurality of subpixels.

Each of the first to ninth power supply switching elements T21 to T29 may receive at least one of the reference voltage Vref, the low-potential driving voltage Vss, and the high-potential driving voltage Vdd according to the image output signal.

As described above, the lighting inspection circuit 200 according to an embodiment of the disclosure may implement component sharing by connecting at least part of a circuit provided for lighting inspection to be compatible according to the driving mode and using it.

According to embodiments of the disclosure, it is possible to switch and use a lighting inspection circuit for each driving mode by connecting the lighting inspection circuit in a compatible manner according to the driving mode.

According to embodiments of the disclosure, a circuit for lighting inspection may be used in each of a lighting inspection mode and a module driving mode, thereby implementing component sharing. Thus, it is possible to increase the use efficiency relative to the area occupied by the lighting inspection circuit as compared with the conventional art.

According to embodiments of the disclosure, it is possible to reduce the size of the non-display area (bezel) of the display panel through component sharing for using the lighting inspection circuit in the lighting inspection mode and module driving mode.

According to embodiments of the disclosure, it is possible to eliminate the need for a dedicated circuit for each of the lighting inspection mode and the module driving mode in the display panel through component sharing for using a lighting inspection circuit for the lighting inspection mode in the module driving mode. Thus, it is possible to lighten the display panel.

In this regard, as compared with the conventional lighting inspection circuit of FIG. 5, the lighting inspection circuit according to an embodiment of the disclosure as illustrated in FIG. 7 may use the circuit configuration for lighting inspection not only in the lighting inspection mode AP but also in the module driving mode MODULE, thereby increasing the use efficiency relative to the area occupied by the lighting inspection circuit 200 in the display device 100 and securing an area of the bezel area.

The selection drive circuit Mux may receive the driving signal from the source drive IC 120 and supply the driving signal for each of the red subpixel RP, the green subpixel GP, and the blue subpixel BP. For example, the selection drive circuit Mux may multiplex and/or de-multiplex the driving signal.

The selection drive circuit Mux may drive all the RGB subpixels using one driving signal. In other words, the selection drive circuit Mux may perform time-division driving using one driving signal to transmit the digital video data for each color of R, G, and B. Accordingly, the number of driving signals may be reduced, thereby facilitating downsizing and integration of the source drive IC 120.

The selection drive circuit Mux may include a first selection drive circuit, a second selection drive circuit, and a third selection drive circuit. The first selection drive circuit may turn on the switching element at a time when the R digital video data is to be supplied to the red subpixel RP, and may supply the R digital video data voltage to the red subpixels RP. The second selection drive circuit may turn on the switching element at a time when the G digital video data is to be supplied to the green subpixel GP, and may supply the G digital video data voltage to the green subpixels GP. The third selection drive circuit may turn on the switching element at a time when the B digital video data is to be supplied to the blue subpixel BP, and may supply the B digital video data voltage to the blue subpixels BP.

At first ends of the plurality of lighting inspection lines DL1 to DL9, the anti-static circuit ESD, which is a component for preventing static electricity from being generated in the plurality of lighting inspection lines DL1 to DL9, may be disposed.

The anti-static circuit ESD may be provided in the source drive IC 120 or may be provided in the non-display area other than the source drive IC 120. The anti-static circuit ESD prevents static electricity generated from the outside of the display device 100 from being transferred to the source drive IC 120 or the display panel 110.

For example, the anti-static circuit ESD may be provided as a circuit D in which the first diode D1 and the second diode D2 are connected in series between the first voltage line Vgh and the second voltage line Vgl. The potential of the first voltage line Vgh is higher than the potential of the second voltage line Vgl.

In the disclosure, a structure in which the anti-static circuit ESD is provided between the lighting inspection circuit 200 and the second power supply unit 320 is disclosed, but the placement position of the anti-static circuit ESD is not limited thereto.

The foregoing embodiments are briefly described below.

A display device according to an embodiment of the disclosure may comprise a display panel including a display area where a plurality of subpixels displaying an image are positioned and a non-display area displaying no image outside the display area, a plurality of lighting inspection lines connected with the plurality of subpixels along a pixel column for each color, a plurality of driving power supply lines supplying driving power to the plurality of subpixels, and a lighting inspection circuit provided in the non-display area and performing lighting inspection on the display panel. The lighting inspection circuit may include a mode signal input pad receiving a lighting inspection signal or driving power according to a driving mode of the display device, a lighting inspection switching element transferring the lighting inspection signal to the plurality of lighting inspection lines when turned on according to the driving mode, and a power supply switching element connected to one end of the lighting inspection switching element and transferring the driving power applied to the mode signal input pad to the plurality of driving power supply lines when turned on according to the driving mode.

The mode signal input pad may be provided in the non-display area.

The driving mode may include a lighting inspection mode (auto probe (AP)) and a module driving mode MODULE.

The mode signal input pad may receive the lighting inspection signal in the lighting inspection mode and receive the driving power in the module driving mode.

The display device may further comprise a lighting inspection pad connected to the lighting inspection switching element and, in the lighting inspection mode, receiving a lighting inspection enable signal to turn on the lighting inspection switching element.

The lighting inspection switching element may include a transistor receiving, through a gate node, the lighting inspection enable signal RGB_EN applied through the lighting inspection pad to turn on in the lighting inspection mode.

The mode signal input pad may include a first mode signal input pad receiving a red lighting inspection signal R or a reference voltage Vref according to the driving mode, a second mode signal input pad receiving a green lighting inspection signal G or a high-potential driving voltage Vdd according to the driving mode, and a third mode signal input pad receiving a blue lighting inspection signal B or a low-potential driving voltage Vss according to the driving mode.

The plurality of lighting inspection lines may include a first lighting inspection line DL1 having one end connected with the first mode signal input pad through the lighting inspection switching element and another end connected to a red subpixel, a second lighting inspection line DL2 having one end connected with the second mode signal input pad through the lighting inspection switching element and another end connected to a green subpixel, and a third lighting inspection line DL3 having one end connected with the third mode signal input pad through the lighting inspection switching element and another end connected to a blue subpixel.

The display device may further comprise a power supply pad connected to the power supply switching element and, in the module driving mode, receiving a power supply enable signal to turn on the power supply switching element.

The power supply switching element may include a transistor receiving, through a gate node, the power supply enable signal applied through the power supply pad to turn on in the module driving mode.

The plurality of driving power supply lines may include a first driving power supply line having one end connected with the first mode signal input pad through the power supply switching element and applying the reference voltage Vref to the plurality of subpixels, a second driving power supply line having one end connected with the second mode signal input pad through the power supply switching element and applying the high-potential driving voltage Vdd to the plurality of subpixels, and a third driving power supply line having one end connected with the third signal input pad through the power supply switching element and applying the low-potential driving voltage Vss to the plurality of subpixels.

The display device may further comprise an anti-static circuit for preventing static electricity.

A lighting inspection circuit according to embodiments of the disclosure may comprise a mode signal input pad receiving a lighting inspection signal or driving power according to a driving mode of a display device, a lighting inspection switching element transferring the lighting inspection signal to a plurality of lighting inspection lines connected to a plurality of subpixels of the display device when turned on according to the driving mode, and a power supply switching element connected to one end of the lighting inspection switching element and, when turned on according to the driving mode, transferring the driving power applied to the mode signal input pad to a plurality of power supply lines connected to the plurality of subpixels.

A source drive IC according to embodiments of the disclosure may comprise the lighting inspection circuit.

The above description has been presented to enable any person skilled in the art to make and use the technical idea of the disclosure, and has been provided in the context of example embodiments and applications. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide examples of the technical idea of the disclosure for illustrative purposes only. That is, the disclosed embodiments are intended to illustrate the scope of the technical idea of the disclosure. Thus, the scope of the present disclosure is not limited to the embodiments discussed herein.

What is claimed:

1. A display device, comprising:

a display panel including a display area including a plurality of subpixels displaying an image are positioned and a non-display area outside the display area and displaying no image;

a plurality of lighting inspection lines connected with the plurality of subpixels, respectively, along a pixel column for each color;

a plurality of driving power supply lines supplying driving power to the plurality of subpixels, respectively; and a lighting inspection circuit provided in the non-display area and configured to perform lighting inspection on the display panel, wherein the lighting inspection circuit includes:

a mode signal input pad receiving a lighting inspection signal or driving power according to a driving mode of the display device;

a lighting inspection switching element configured to transfer the lighting inspection signal to the plurality of lighting inspection lines when turned on according to the driving mode; and a power supply switching element connected to one end of the lighting inspection switching element and configured to transfer the driving power applied to the mode signal input pad to the plurality of driving power supply lines when turned on according to the driving mode, and wherein the mode signal input pad includes:

a first mode signal input pad receiving a red lighting inspection signal or a reference voltage according to the driving mode; and a second mode signal input pad receiving a green lighting inspection signal or a high-potential driving voltage according to the driving mode.

2. The display device of claim 1, wherein the mode signal input pad is provided in the non-display area.

3. The display device of claim 1, wherein the driving mode includes a lighting inspection mode and a module driving mode.

4. The display device of claim 3, wherein the mode signal input pad receives the lighting inspection signal in the lighting inspection mode and receives the driving power in the module driving mode.

5. The display device of claim 3, further comprising a lighting inspection pad connected to the lighting inspection switching element and, in the lighting inspection mode, receiving a lighting inspection enable signal to turn on the lighting inspection switching element.

6. The display device of claim 5, wherein the lighting inspection switching element includes a transistor receiving, through a gate node, the lighting inspection enable signal applied through the lighting inspection pad to turn on in the lighting inspection mode.

7. The display device of claim 3, further comprising a power supply pad connected to the power supply switching element and, in the module driving mode, receiving a power supply enable signal to turn on the power supply switching element.

8. The display device of claim 7, wherein the power supply switching element includes a transistor receiving, through a gate node, the power supply enable signal applied through the power supply pad to turn on in the module driving mode.

9. The display device of claim 1, wherein the mode signal input pad further includes:

a third mode signal input pad receiving a blue lighting inspection signal or a low-potential driving voltage according to the driving mode.

10. The display device of claim 9, wherein the plurality of lighting inspection lines include:

a first lighting inspection line having one end connected with the first mode signal input pad through the lighting inspection switching element and another end connected to a red subpixel;

a second lighting inspection line having one end connected with the second mode signal input pad through the lighting inspection switching element and another end connected to a green subpixel; and a third lighting inspection line having one end connected with the third mode signal input pad through the lighting inspection switching element and another end connected to a blue subpixel.

11. The display device of claim 9, wherein the plurality of driving power supply lines include:

a first driving power supply line having one end connected with the first mode signal input pad through the power supply switching element and applying the reference voltage to the plurality of subpixels;

a second driving power supply line having one end connected with the second mode signal input pad through the power supply switching element and applying the high-potential driving voltage to the plurality of subpixels; and a third driving power supply line having one end connected with the third mode signal input pad through the power supply switching element and applying the low-potential driving voltage to the plurality of subpixels.

12. The display device of claim 1, further comprising an anti-static circuit for preventing static electricity.

13. A lighting inspection circuit, comprising:

a mode signal input pad receiving a lighting inspection signal or driving power according to a driving mode of a display device;

a lighting inspection switching element transferring the lighting inspection signal to a plurality of lighting inspection lines connected to a plurality of subpixels of the display device when turned on according to the driving mode; and a power supply switching element connected to one end of the lighting inspection switching element and, when turned on according to the driving mode, transferring the driving power applied to the mode signal input pad to a plurality of power supply lines connected to the plurality of subpixels, wherein the mode signal input pad includes:

a first mode signal input pad receiving a red lighting inspection signal or a reference voltage according to the driving mode; and a second mode signal input pad receiving a green lighting inspection signal or a high-potential driving voltage according to the driving mode.

14. The lighting inspection circuit of claim 13, wherein the driving mode includes a lighting inspection mode and a module driving mode.

15. The lighting inspection circuit of claim 14, further comprising a lighting inspection pad connected to the lighting inspection switching element and, when the driving mode is the lighting inspection mode, receiving a lighting inspection enable signal to turn on the lighting inspection switching element.

16. The lighting inspection circuit of claim 15, wherein the lighting inspection switching element includes a transistor receiving, through a gate node, the lighting inspection enable signal applied through the lighting inspection pad to turn on in the lighting inspection mode.

17. The lighting inspection circuit of claim 14, further comprising a power supply pad connected to the power supply switching element and, when the driving mode is the module driving mode, receiving a power supply enable signal to turn on the power supply switching element.

18. The lighting inspection circuit of claim 17, wherein the power supply switching element includes a transistor receiving, through a gate node, the power supply enable signal applied through the power supply pad to turn on in the module driving mode.

19. The lighting inspection circuit of claim 14, wherein the mode signal input pad receives the lighting inspection signal in the lighting inspection mode and receives the driving power in the module driving mode.

20. The lighting inspection circuit of claim 13, wherein the mode signal input pad further includes:

a third mode signal input pad receiving a blue lighting inspection signal or a low-potential driving voltage according to the driving mode.

21. A source drive IC comprising the lighting inspection circuit of claim 13.

* * * * *